United States Patent
Thomsen et al.

(10) Patent No.: US 10,559,293 B2
(45) Date of Patent: Feb. 11, 2020

(54) DIGITAL MICROPHONE NOISE ATTENUATION

(71) Applicant: Knowles Electronics, LLC, Itasca, IL (US)

(72) Inventors: Henrik Thomsen, Holte (DK); Yu Du, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/124,794

(22) Filed: Sep. 7, 2018

(65) Prior Publication Data
US 2019/0080680 A1    Mar. 14, 2019

Related U.S. Application Data

(60) Provisional application No. 62/556,181, filed on Sep. 8, 2017.

(51) Int. Cl.
| | |
|---|---|
| *G10K 11/178* | (2006.01) |
| *B81B 3/00* | (2006.01) |
| *H04R 3/00* | (2006.01) |
| *H04R 17/02* | (2006.01) |

(52) U.S. Cl.
CPC ...... *G10K 11/17853* (2018.01); *B81B 3/0021* (2013.01); *H04R 3/005* (2013.01); *H04R 17/02* (2013.01); *B81B 2201/0257* (2013.01); *G10K 2210/3028* (2013.01)

(58) Field of Classification Search
CPC ...... G10K 11/17853; G10K 2210/3028; B81B 3/0021; B81B 2201/0257; H04R 3/005; H04R 17/02

USPC ................................................ 381/71, 14
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |

(Continued)

FOREIGN PATENT DOCUMENTS

| | | |
|---|---|---|
| JP | 2013-163596 A | 6/2003 |
| WO | WO-2016/179392 A1 | 11/2016 |

OTHER PUBLICATIONS

Buxton, J., "Analog Dialogue: a forum for the exchange of circuits, systems, and software for real-world signal processing," retrieved from https://www.analog.com/media/en/analog-dialogue/volume-28/number-1/articles/volume28-number1.pdf, pp. 27-28 (Dec. 31, 1994).

(Continued)

*Primary Examiner* — David L Ton
(74) *Attorney, Agent, or Firm* — Foley & Lardner LLP

(57) ABSTRACT

A digital microphone device includes circuitry that can reduce the risk of noise caused due to an idle tone frequency component in a digital signal output by the digital microphone device. In stereo mode and other applications where interference occurs between two or more such microphones, each microphone device includes a digital output having a corresponding idle tone frequency, one of which is offset to shift noise components outside of a desired frequency range.

20 Claims, 7 Drawing Sheets

(56) References Cited

U.S. PATENT DOCUMENTS

| | | |
|---|---|---|
| 7,856,804 B2 | 12/2010 | Laming et al. |
| 7,903,831 B2 | 3/2011 | Song |
| 2005/0207605 A1 | 9/2005 | Dehe et al. |
| 2007/0139241 A1 | 6/2007 | Hales et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2009/0279719 A1* | 11/2009 | Lesso ............... B06B 1/0292 381/174 |
| 2009/0316935 A1* | 12/2009 | Furst ............... H03F 1/3211 381/111 |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0315272 A1* | 12/2010 | Steele ............... G01D 3/032 341/110 |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2012/0043974 A1* | 2/2012 | van den Boom ... H03M 1/1295 324/658 |
| 2017/0023429 A1* | 1/2017 | Straeussnigg ......... G01L 9/0072 |

OTHER PUBLICATIONS

International Search Report and Written Opinion, PCT/US2018/049933, Knowles Electronics, LLC (dated Nov. 19, 2018).

* cited by examiner

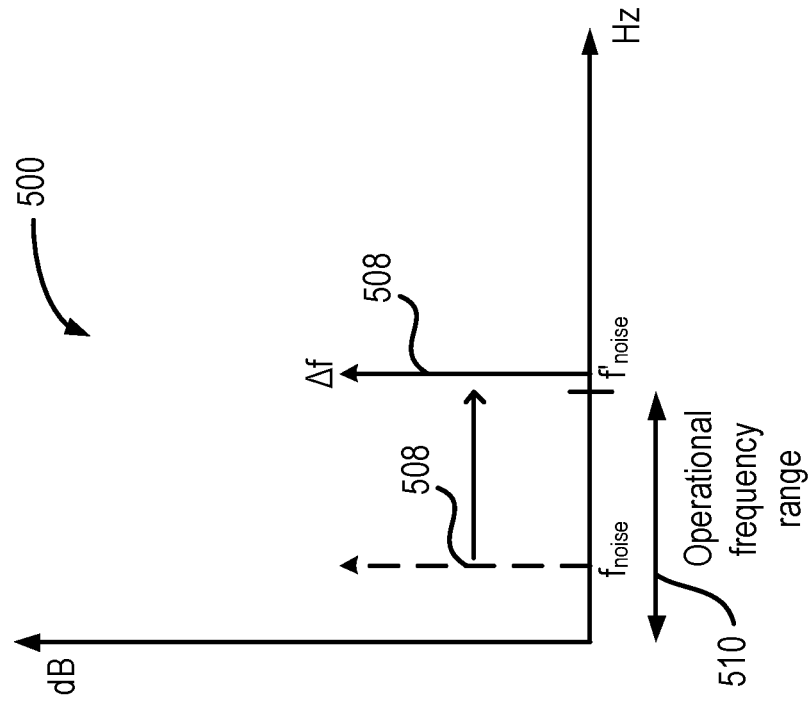
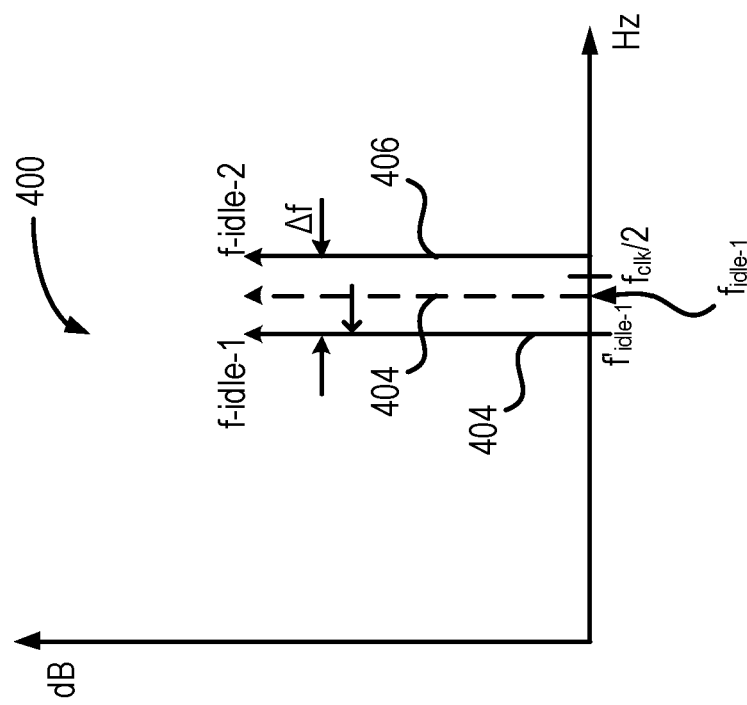
Figure 5
Figure 4

DIGITAL MICROPHONE NOISE ATTENUATION

CROSS-REFERENCE TO RELATED APPLICATIONS

This application claims the benefit of and priority to U.S. Provisional Patent Application No. 62/556,181, filed Sep. 8, 2017, the entire contents of which are incorporated herein by reference.

FIELD OF THE DISCLOSURE

The present disclosure relates generally to microphones and more particularly to reduction of noise or interference in digital microphones, for example in digital microelectromechanical systems (MEMS) microphone devices, and methods therefor.

The present disclosure relates generally to microphones and more particularly to reduction of noise or interference in digital microphones, for example in digital microelectromechanical systems (MEMS) microphone devices, and methods therefor.

BACKGROUND

Microelectromechanical system (MEMS) microphones are deployed in various devices including consumer electronics and vehicles among other applications and host devices. Such microphones include an assembly of one or more transducers and one or more integrated circuits typically disposed in a housing formed by a lid or cover fastened to a substrate having an external device interface. The transducer is embodied as a MEMS die that detects pressure changes within the housing via an acoustic port through the lid or substrate and the interface is typically configured for surface mounting on a printed circuit board using reflow soldering or other technology.

Some MEMS microphones output a digital signal having an idle tone frequency based on a frequency of the digital circuit clock. For example, PDM microphones output a 1-bit PDM signal including an idle tone frequency that is one-half of the clock frequency. In stereo and other applications where two or more microphones are employed, mixing of the idle tone frequencies or other effects may cause unwanted noise at the output of one or both microphones. The idle tone frequencies may be slightly different due to manufacturing variations or other causes.

FIG. 1 depicts a first plot 100 showing different idle tone frequencies generated by left and right microphones in a stereo system in the frequency spectrum. In particular, the first plot 100 depicts a first idle tone frequency 104 (labeled "f-idle-1") and a second idle tone frequency 106 (labeled "f-idle-2") generated by left and right microphone signals, respectively, in a stereo system. FIG. 2 depicts a second plot 200 illustrating an intermodulation (IM) component 208 (labeled "Δf") resulting from mixing the different idle tone frequencies f-idle-1 104 and f-idle-2 106 in FIG. 1, wherein the IM component 208 lies in the operational frequency range 210 where it may cause noise or interference.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 4 depicts a third plot of idle tones produced by two different microphone devices of the type shown in FIG. 3.

FIG. 5 depicts a fourth plot of an intermodulation frequency component resulting from mixing the idle tones shown in FIG. 4.

Figure 2:
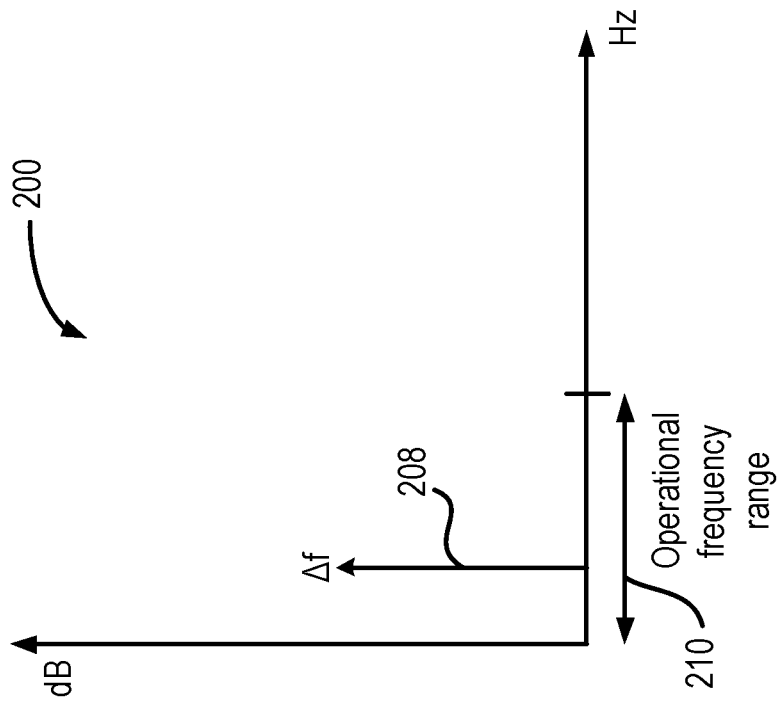
FIG. 2 depicts a second plot illustrating an intermodulation component resulting from mixing of the different idle tone frequencies depicted in FIG. 1.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and methods therein for reducing noise in digital microphone devices, such as those incorporating microelectromechanical (MEMS) transducers. In some embodiments, the devices and techniques described reduce noise caused by the mixing of idle tone frequencies or other effects in applications where multiple microphones are employed, for example where multiple microphones share a common bus or where multiple microphones are otherwise subject to interfering signals from one another. In one embodiment, the idle tone frequency of one of two digital microphone devices may be offset relative to the idle tone frequency of the other microphone device to shift the intermodulation (IM) or mixing components outside of the frequency range of interest according to the following expression:

$$|f_{idle1} - f_{idle2}| > \text{bandwidth of interest}$$

For audio applications, the bandwidth of interest is somewhere between about 20 Hz and about 20 kHz. The perceptible audio frequency range varies from person to person and depends generally on genetic variation and age among other factors. In other applications however the bandwidth of interest may lie partially or wholly outside the audio band.

More generally, where more than two microphones are subject to interference from one another, the idle tone frequencies of all the microphone outputs may be separated to avoid noise in the frequency band of interest. In one embodiment, each microphone is hardwired to provide an output at one idle mode frequency or another. For stereo mode applications, two microphones hardwired for different idle tone frequencies could be used to avoid interference or noise. In an alternative embodiment, one of the two microphones is configured to selectively offset its idle mode frequency relative to the other microphone under certain conditions, for example when used in a stereo mode. In applications requiring more than two microphones, noise may be eliminated or reduced by using microphones having different idle tone frequencies. Here too, different hardwired microphones may be used, or alternatively the microphones may be selectively configured for different idle tone frequencies when necessary to shift the IM components beyond the frequency band of interest.

In an embodiment, a digital microphone assembly converts an analog signal output by an acoustic transducer to a digital signal. In one implementation, the transducer is a microelectromechanical systems (MEMS) transducer but other types of transducers may be used alternatively. A direct current (DC) signal component is removed from the digital signal before converting the digital signal to a pulse density modulated (PDM) signal having an idle tone frequency that is approximately one-half a frequency at which at least a portion of the integrated circuit is clocked. The idle tone frequency is selectively offset by applying a DC offset to the digital signal after removing the DC signal component and before converting the digital signal into a PDM signal.

In another embodiment, a microphone device includes an acoustic microelectromechanical systems (MEMS) transducer configured to generate an analog signal responsive to an acoustic signal, and a signal processing circuit, coupled to the transducer. The signal processing circuit includes an analog-to-digital converter configured to convert the analog signal generated by the transducer to a digital signal. The signal processing circuit also includes a filter configured to remove a direct current (DC) signal component from the digital signal. The signal processing circuit also includes a DC offset circuit configured to apply a DC offset to the digital signal after the DC component is removed. The signal processing circuit also includes a digital-to-digital converter configured to convert the digital signal having the DC offset to a pulse density modulated (PDM) signal having an idle tone frequency that is approximately one-half a clock frequency provided to at least a portion of the signal processing circuit.

In an embodiment, an audio signal processing circuit for a microphone device includes an analog to digital converter configured to convert an analog signal received from an acoustic transducer to a digital signal. The signal processing circuit also includes a filter configured to remove a direct current (DC) signal component from the digital signal. The signal processing circuit further includes a DC offset circuit configured to apply a DC offset to the digital signal after the DC signal component is removed. The signal processing circuit also includes a digital-to-digital converter configured to convert the digital signal to a 1-bit pulse density modulated (PDM) signal after the DC offset is applied to the digital signal, where the PDM signal has an idle tone frequency that is offset by the DC offset and the offset idle tone frequency is approximately one-half a clock frequency provided to at least a portion of the signal processing circuit.

Figure 1:
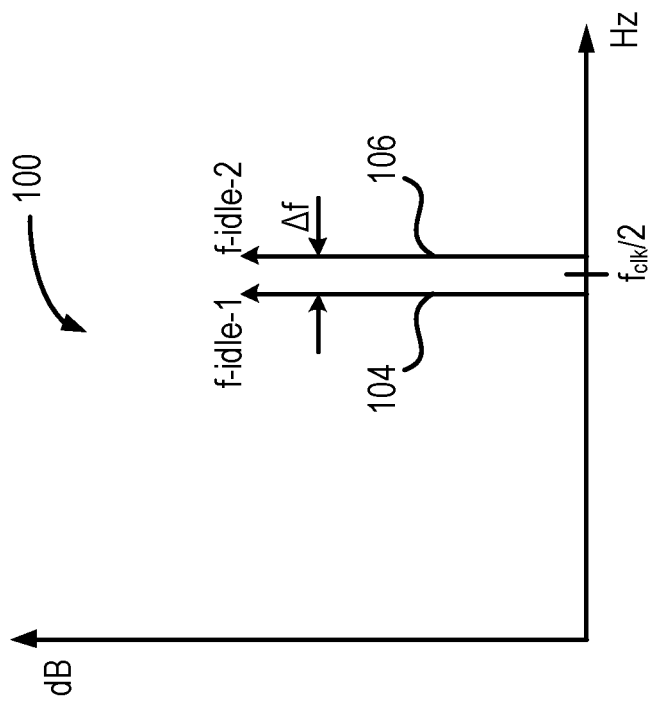
FIG. 1 depicts a first plot showing different idle tone frequencies generated by left and right microphones in a stereo system.
Figure 3:
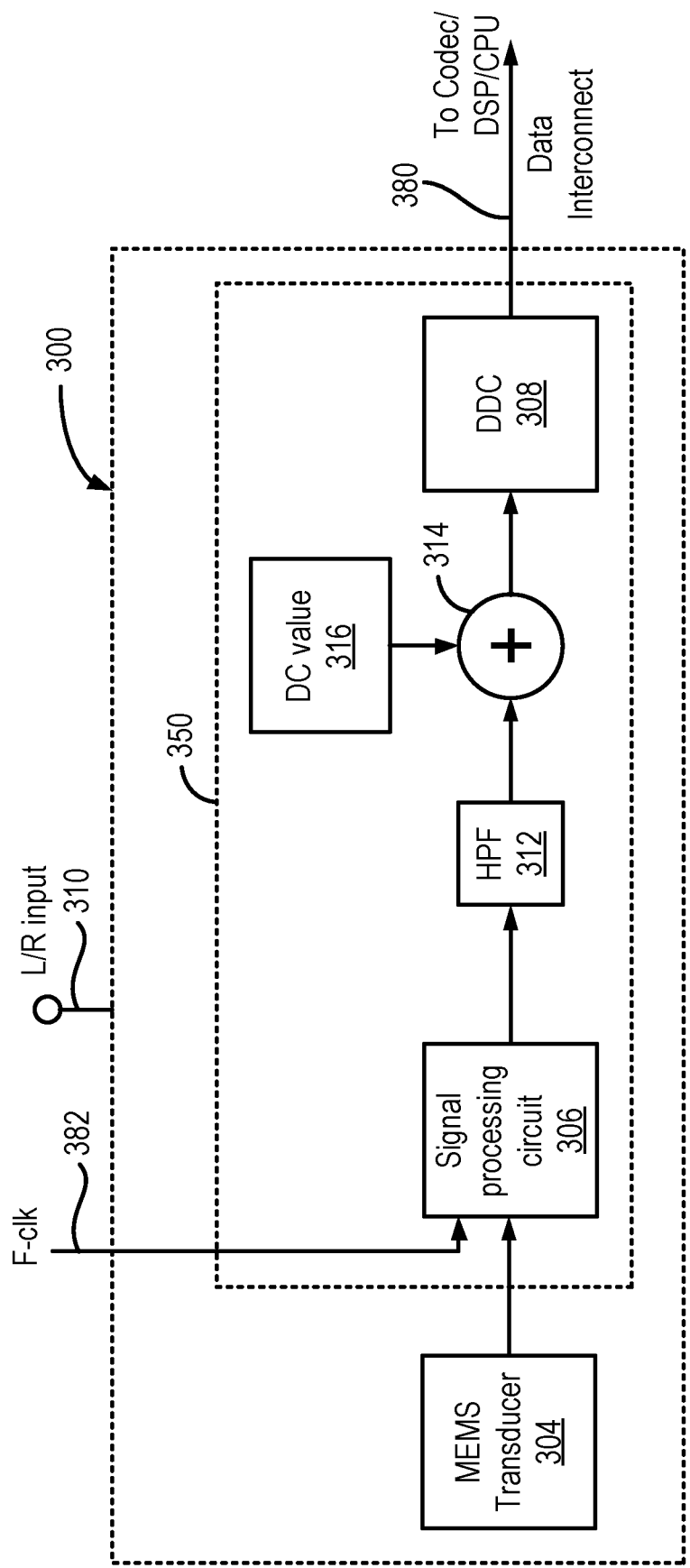
FIG. 3 depicts a digital microphone device for processing acoustic signals.

FIG. 3 depicts a digital microphone device 300 including a transducer 304 and an electrical circuit 350 for processing acoustic signals and for removing or reducing noise caused by idle frequencies discussed above in relation to FIGS. 1 and 2. The electrical circuit 350 comprises a signal processing circuit 306, a high pass filter (HPF) 312, a DC value input 316, an adder 314, and a digital-to-digital converter (DDC) 308. In one or more embodiments, some or all of the signal processing circuit 306, the HPF 312, the adder 314, the DC value input 316, and the DDC 308 can be implemented in one or more an integrated circuits, such as an application specific integrated circuit (ASIC), a programmable digital signal processor, or a combination thereof. The MEMS transducer 304 can convert acoustic energy into analog electrical signals. For example, the MEMS transducer 304 can generate an analog signal representing an acoustic energy incident on the MEMS transducer 304. The signal processing circuit 306 can include analog and/or digital circuitry such as, for example, amplifiers, filters, analog-to-digital converters, digital signal processor, and other electrical circuitry for processing the analog signals received from the MEMS transducer 304. For example, the signal processing circuit 306 can carry out analog signal amplification, analog filtering, and level shifting on the analog signals received from the MEMS transducer 304. Additional processing can include analog signal sampling, analog-to-digital conversion, digital filtering and other digital processing operations. A clock signal 382 can be provided to the electrical circuit 350. While the clock signal 382 is shown in FIG. 3 as being provided to the signal processing circuit 306, the clock signal 382 or multiples or divisions thereof can be provided to any component of the electrical circuit 350. Different clock signals may also be provided to different portions of the digital microphone device 300.

The signal processing circuit 306 can process the analog signal received from the MEMS transducer 304 and generate a multi-bit digital signal, where the number of bits representing the digital signal can be, for example, from 2-bits to 64-bits, or 20-bits. The signal processing circuit 306 can output the digital signal at a frequency that is a function of the frequency $f_{clk}$ of the clock signal 382. For example, in one or more embodiments, the signal processing circuit 306 can output the digital signal at frequency that is equal to the clock frequency $f_{clk}$.

The HPF 312 receives the digital signal generated by the signal processing circuit 306 and filters the digital signal to generate a filtered digital signal. The HPF 312 is a high-pass filter, and attenuates frequency components of the digital signal that are below a cut-off frequency. The HPF 312 can have a cut-off frequency that is low enough to substantially attenuate, or completely remove, a direct-current (DC) component of the digital signal. For example, the cut-off frequency of the HPF 312 can be set at a few Hz, such as, for example, at about 5 Hz, or at about 10 Hz. Thus, the filtered digital signal output by the HPF 312 does not include, or includes a highly attenuated, DC component. The HPF may be implemented as an infinite impulse response (IIR) filter, a finite impulse response (FIR) filter or as some other digital filter suitable for removing the DC component.

The filtered digital signal output by the HPF 312 is provided to the adder 314. The adder 314 also receives a DC value from the DC value input 316. The adder can add the DC value received from the DC value input 316 to the filtered digital signal received from the HPF 312, and generate an offset digital signal. The adder 314 can include a digital adder that can add the DC value to the time sample values of the filtered digital signal.

The DDC 308 receives the offset digital signal from the adder 314, and converts the offset digital signal into an encoded digital signal. The DDC 308 can include a digital-to-digital converter that can convert a multi-bit digital signal into another multi-bit or single-bit digital signal. In some such embodiments, the number of bits of the converted digital signal can be equal to or less than the number of bits of the input digital signal. For example, the input digital signal can be a 20-bit signal and the converted digital signal can be a 1-bit signal. In some other such implementations, the number of bits of the converted digital signal can be greater than the number of bits of the input digital signal. In one or more embodiments, the DDC 308 can include a digital encoder for converting the multi-bit digital signal. For example, a 1-bit pulse-density modulation (PDM) encoder can be used, which can convert a multi-bit pulse-code-modulation (PCM) digital signal into a corresponding stream of 1-bit digital signal. Thus, the output of the DDC 308 can be a 1-bit encoded digital signal.

The DDC 308 outputs the encoded digital signal onto a data interconnect 380, which can be connected to a codec or a digital signal processor for further processing. The data interconnect may also be connected to another digital microphone device when, for example, the digital microphone device 300 is connected in stereo mode. In stereo mode, the encoded digital signals of both the digital microphone device 300 and the other digital microphone device can be provided to the digital signal processor or a codec via the data interconnect 380. The two encoded digital signals can be time domain multiplexed over the data interconnect 380. In time domain multiplexing, a first digital microphone device can be configured to output a first encoded digital signal on a first edge (rising or falling) edge of the clock signal 382, while a second digital microphone device can be configured to output a second encoded digital signal on a second edge (falling or rising) of the clock signal 382. Of course, other time domain multiplexing techniques, or other multiplexing techniques, also can be used. In some embodiments, the digital microphone device 300 can include an L/R input 310, indicating the audio channel that the digital microphone device 300 is assigned to. For example, the L/R input 310 of the digital microphone device 300 being connected to a first voltage (e.g., supply voltage, VDD) can indicate that the digital microphone device 300 is assigned a left audio channel, while the L/R input 310 being connected to a second voltage (e.g., ground voltage, GND) can indicate that the digital microphone device 300 is assigned to a right audio channel.

The first idle tone frequency associated with the digital microphone device 300 can be a function of the clock frequency $f_{clk}$ and a DC value of the digital signal encoded by the first DDC. In some embodiments, this relationship can be given by the following Equation (1):

$$f_{idle-1} = \frac{f_{clk}}{2}(1 - DC) \quad (1)$$

where, $f_{idle-1}$ denotes the idle tone frequency, $f_{clk}$ denotes the clock frequency of the clock signal, and DC denotes the DC value (in reference to the digital full scale) of the digital signal provided to the DDC. In some implementations, $f_{clk}$ can denote the sampling frequency of the 1-bit encoded digital signal output by the DDC 308. By selecting a particular DC value, the idle tone frequency $f_{idle-1}$ can be changed. The idle noise component 208, shown in FIG. 2, is a result of the difference between the first idle tone frequency 104 and the second idle tone frequency 106, shown in FIG. 1. The first idle tone frequency 104 shown in FIG. 1 can represent the idle tone frequency generated by the digital microphone device 300 of FIG. 3. Therefore, by changing the frequency of the first idle tone, the frequency of the noise component can be changed. The change in the frequency of the noise component is a function, in part, of the DC value. Therefore, an appropriate DC value can be selected such that the corresponding change in the frequency of the noise component is sufficient to move the noise component outside of the operational frequency range as discussed further herein.

FIG. 4 depicts a third plot 400 of first and second idle tones ($f_{idle-1}$ and $f_{idle-2}$) produced by two different microphone devices of the type shown in FIG. 3. FIG. 5 depicts a fourth plot 500 of an intermodulation frequency component resulting from mixing the idle tones shown in FIG. 4. The third plot 400 shows that the frequency of the first idle tone 404 is changed from $f_{idle-1}$ to $f'_{idle-1}$ As a result, as shown in the fourth plot 500, the frequency of the noise component 508, which is an IM frequency, changes from $f_{noise}$ to $f'_{noise}$, which is outside of the operational frequency range 510.

Referring again to FIG. 3, the filtered digital signal output by the HPF 312 is substantially devoid of a DC signal component. The filtered digital signal is provided to the adder 314, which adds a DC value provided by the DC value input 316 to the filtered digital signal to generate the offset digital signal. The offset digital signal is processed by the DDC 308 to generate the encoded digital signal, which includes an idle tone having a frequency $f_{idle-1}$ that has been shifted relative to an idle tone frequency that would have been generated in the absence of the DC offset. In FIG. 4, the second idle tone 406 generated by a second digital microphone device will have a frequency $f_{idle-2}$ at about one-half the clock frequency. As a result, with the appropriate selection of the DC value, the difference between the frequencies of the two idle tones will result in a noise component 508 that is outside of the operational frequency range 510. By shifting the noise component 508 outside of the operational frequency range 510, a signal-to-noise ratio of the signals generated by the digital microphone device can be improved.

Figure 6:
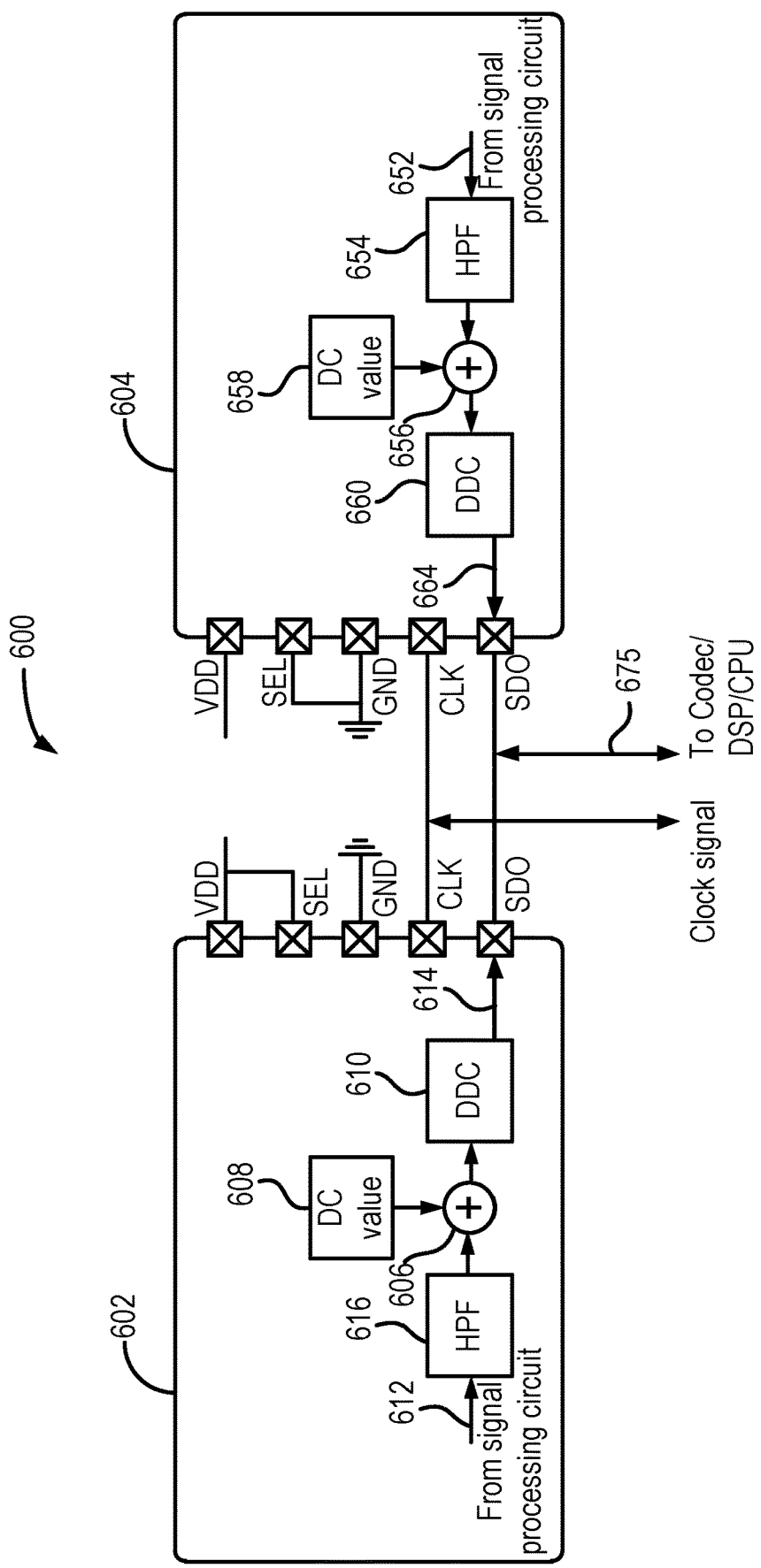
FIG. 6 illustrates a system including a left digital microphone device and a right digital microphone device connected in stereo mode.

FIG. 6 illustrates a system 600 including a left digital microphone device 602 and a right digital microphone device 604 connected in stereo mode. The left digital microphone device 602 and the right digital microphone device 604 can be devices that include a transducer and processing circuitry to generate digital signals corresponding to incident audio energy. Each of the left digital microphone device 602 and the right digital microphone device 604 can be implemented as the digital microphone device shown in FIG. 3. The left digital microphone device 602 includes a left high pass filter (HPF) 616, a left adder 606, a left DC value input 608 and a left digital-to-digital converter (DDC) 610. While not shown, the left digital microphone device 602 also includes an audio transducer (such as, for example, a MEMS transducer) and a signal processing circuit, which can process the signals generated by the audio transducer and generate a left digital signal 612 provided to the left HPF 616. The right digital microphone device 604 includes a right HPF 654, a right adder 656, a right DC value input 658 and a right DDC 660. While not shown, the right digital microphone device 604 also includes an audio transducer (such as, for example, a MEMS transducer) and a signal processing circuit, which can process the signals generated by the audio transducer and generate a right digital signal 652 provided to the right HPF 654. The audio transducer and the signal processing circuits can be similar to the transducer and the signal processing circuit discussed above in relation to FIG. 3. The left DDC 610 can generate a left encoded digital signal 614, while the right DDC 660 can generate a right encoded digital signal 664. The left encoded digital signal and the right encoded digital signals can be time domain multiplexed on the data interconnect 675.

Both the left digital microphone device 602 and the right digital microphone device 604 include an external device interface. In one embodiment, the external device interface includes a VDD terminal, a SEL (select) terminal, a GND terminal, a CLK (clock) terminal, and a SDO (digital output) terminal. The VDD terminal receives a power supply voltage, the GND terminal is connected to a ground voltage, the SEL terminal is connected to either VDD or GND based on whether the corresponding device is assigned to a left channel or a right channel (the SEL terminal can be coupled to the L/R input 310 discussed above in relation to FIG. 3). For example, the SEL terminal of the left digital microphone device 602 is coupled to VDD to assign it to the left channel, while the SEL terminal of the right digital microphone device 604 is coupled to GND to assign it to the right channel. The CLK terminal receives a clock signal, and the SDO terminal is coupled to a data interconnect 675, which, in turn, is connected to additional processing circuitry such as a DSP and codec. In other embodiments, the interface may have other terminals or contacts depending on the interface protocol.

Each of the left digital microphone device 602 and the right digital microphone device 604 is capable of generating an offset encoded digital signal at its respective SDO terminal. In one or more embodiments, only one of the two microphone devices may generate an offset encoded digital signal. For example, if the left DC value input 608 is enabled to add a DC signal component to the left filtered digital signal, then the right DC value input 658 is disabled, such that the right filtered digital signal output by the right HPF 654 is fed to the right DDC 660 without having a DC signal component added to it (e.g., by adding a zero DC value input). Of course, in some embodiments, the right DC value input 658 can be enabled to add a DC signal component to the right filtered digital signal before being fed to the right DDC 660, and the left DC value input 608 can be disabled, such that the left filtered digital signal output by the left HPF 616 is fed to the left DDC 610 without having a DC signal component added to it (e.g., by adding a zero DC value input).

In some embodiments, the left SEL terminal and the right SEL terminal can be used to determine which of the left DC value input 608 and the right DC value input 658 is enabled. As discussed above, in the stereo mode, one of the left SEL terminal and the right SEL terminal is connected to VDD, while the other can be connected to GND. The DC value input of only that digital microphone device whose corresponding SEL is coupled to GND can be enabled. For example, in the system 600 shown in FIG. 6, the right DC value input 658 would be enabled because the right SEL terminal is coupled to GND, while the right SEL terminal is coupled to VDD. In some embodiments, DC value input of only that digital microphone device assigned to the right audio channel is enabled, while the DC value input for the digital microphone device assigned to the left channel is disabled. In some embodiments the reverse can be applied. The right offset digital signal generated by the right digital microphone device can be similar to the offset encoded signal generated by the DDC 308 discussed above in relation to FIG. 3, resulting in the noise signal being shifted outside of the operational frequency range of the system 600.

In one or more embodiments, both the left DC value input 608 and the right DC value input 658 can be enabled such that both the left digital microphone device 602 and the right digital microphone device 604 generate respective offset encoded digital signals. In some such embodiments, the DC signal component added by the left DC value input 608 and the DC signal component added by the right DC value input 658 are selected to be unequal. Specifically, the difference in the values of these DC signal components can be selected such that the frequency of the resulting noise component is outside of the operational frequency range. That is, referring to FIGS. 4 and 5, the right DC value input 658 can output a DC component such that the second idle tone, $f_{idle-2}$, is also changed (in a manner similar to Equation (1) discussed above for changing $f_{idle-1}$), such that changes in both the first and second idle tones contribute to the change in the frequency of the noise component 508. In some implementations, the left DC value input 608 and the right DC value input 658 can be selected such that one adds a positive DC signal component while the other adds a negative DC signal component. This can result in the idle tone frequency associated with the left digital microphone device 602 to decrease and the idle tone frequency associated with the right digital microphone device 604 to increase, thereby increasing the frequency of the noise component to a value that is outside of the operational frequency range of the system 600.

In one embodiment, the acoustic transducer is a condenser microphone implemented as a MEMS die. In other embodiments the transducer is a piezoelectric transducer implemented as a MEMS die or some other electro-mechanical transducer implemented using a known or future technology.

Figure 7:
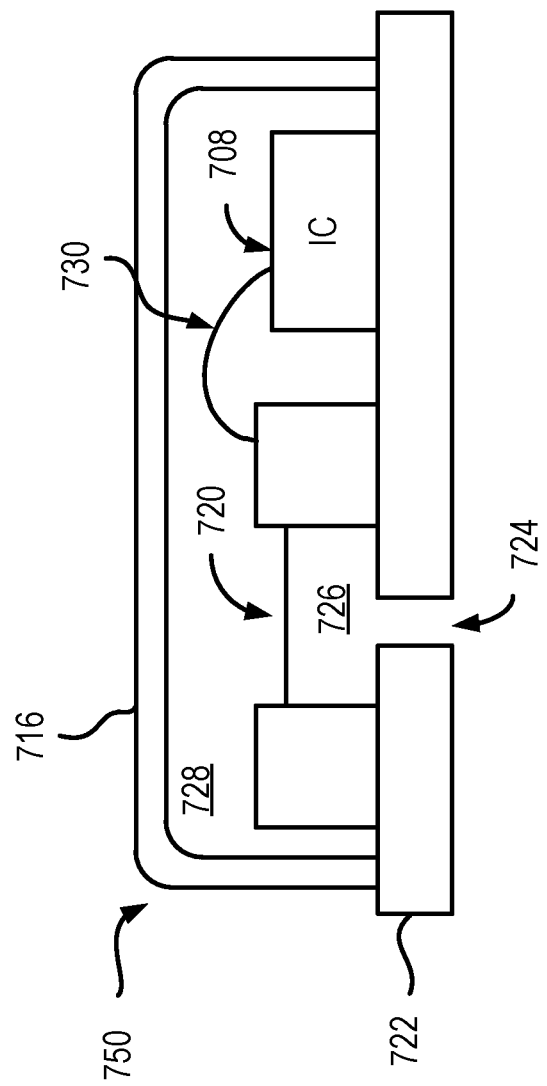
FIG. 7 illustrates a cross-sectional view of an example bottom-port digital microphone assembly.

FIG. 7 illustrates a cross-sectional view of an example bottom-port digital microphone assembly 750 that can be used to implement a digital microphone device. In particular, the example digital microphone assembly 750 can be used to implement the left digital microphone device 602 and the right digital microphone device 604 discussed above in relation to FIG. 6.

The digital microphone assembly 750 includes a substrate 722 and a cover or lid 716 disposed on the substrate 722 to form a housing. The housing encloses a MEMS transducer 720, and an integrated circuit (IC) 708. The MEMS transducer 720 includes a movable diaphragm positioned in close proximity to a back plate. The diaphragm is configured to move in relation to the back plate in response to incident acoustic energy, thereby changing a capacitance between the diaphragm and the back plate. The change in capacitance can be transformed into a change in the electrical signal such as a current or a voltage. The substrate 722 defines a sound port 724. Alternatively, the sound port may be formed in the cover. In either case the MEMS transducer 720 divides the volume of the housing into a front volume and a back volume. In bottom port devices, the front volume 726 opens to the outside of the digital microphone assembly 750 through the port 724. The back volume 728 is enclosed by a space enclosed by the cover 716. The port 724 allows acoustic energy to enter the front volume 726 and be incident on the MEMS transducer 720, which transforms the incident acoustic energy into corresponding electrical signals. The electrical signals generated by the MEMS transducer 720 can be processed by the IC 708, which can include analog and digital circuitry discussed above with referenced to FIG. 3. The digital microphone assembly 750 also can include an external device interface including one or more terminals (such as the terminals discussed above in relation to FIG. 6). The terminals can be implemented using pins, bonding pads, wires, and other electrical connectors. The external device interface includes contacts or terminals formed on the substrate 722 or cover 716. The terminals are coupled to components inside the digital microphone assembly 750 by electrical conductors.

Figure 8:
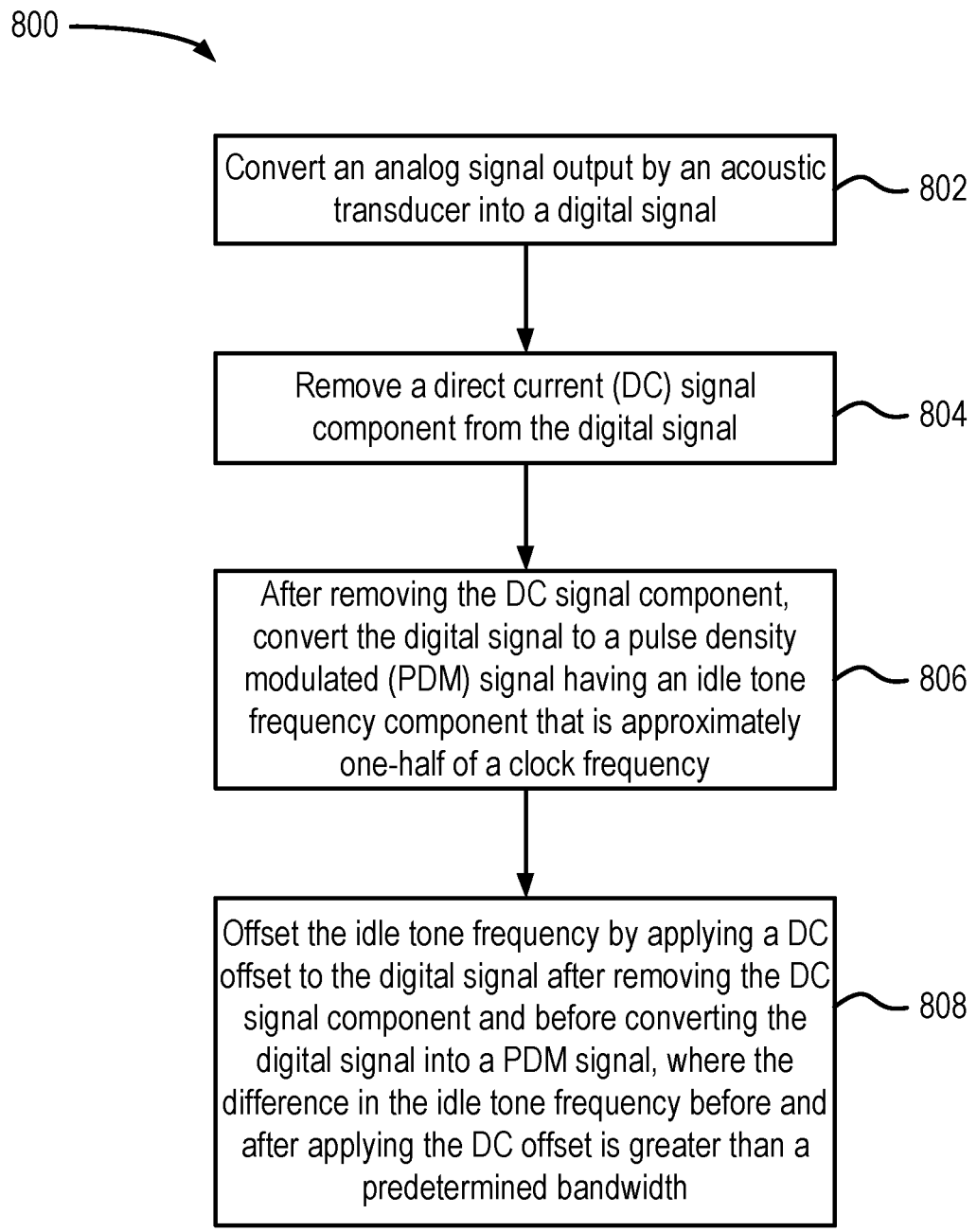
FIG. 8 shows a flow diagram of an example process 800 used for reducing idle tone frequency noise.

FIG. 8 shows a flow diagram of an example process 800 used for reducing idle tone frequency noise. The process 800 includes converting an analog signal output by an acoustic transducer into a digital signal (stage 802). For example, as shown in FIG. 3, the signal processing circuit 306 converts the analog signal output by the MEMS transducer 304 into a digital signal. The method also includes removing a direct current (DC) signal component from the digital signal (stage 804). For example, as shown in FIG. 3, the HPF 312 filters or removes a DC component from the digital signal output by the signal processing circuit 306.

The process 800 also includes after removing the DC signal component, converting the digital signal to a pulse density modulated (PDM) signal having an idle tone frequency that is approximately one-half of a clock frequency (stage 806). For example, as shown in FIG. 3, the DDC 308 converts the filtered digital signal output by the HPF 312 into an encoded digital signal using pulse-density modulation. Further, as shown in FIG. 4, the encoded digital signal includes a first idle tone 404 having a frequency $f_{idle-1}$, which is approximately equal to one-half of the clock frequency $f_{clk}$.

The process additionally includes offsetting the idle tone frequency by applying a DC offset to the digital signal after removing the DC signal component and before converting the digital signal into a PDM signal, where the difference in the idle tone frequency before and after applying the DC offset is greater than a predetermined bandwidth (stage 808). One example of this process stage has been discussed above in relation to FIGS. 3-5. For example, as shown in FIG. 3, the adder 314 adds a DC value to the filtered digital signal output by the HPF 312 before the filtered digital signal is converted into the encoded digital signal by the DDC 308. As shown in FIG. 4, by adding the DC value, the frequency of the first idle tone 404 is shifted from $f_{idle-1}$ to $f'_{idle-1}$. This, in turn results in the shifting of the frequency of the noise component 508 from $f_{noise}$ to $f'_{noise}$ as shown in FIG. 5. The change in the frequency of the first idle tone 404 is selected to be such that it is sufficient to move the frequency of the noise component 508 to outside of the desired operational frequency range 510. In some embodiments, the shift in the frequency of the first idle tone 404 can be approximately equal to the operational frequency range 510. As mentioned above, in some embodiments, the operational frequency range can be equal to the human audible frequency range. In other embodiments however the operational frequency range extends beyond the human audible frequency range, for example, in applications where ultrasonic signals are used.

Figure 9:
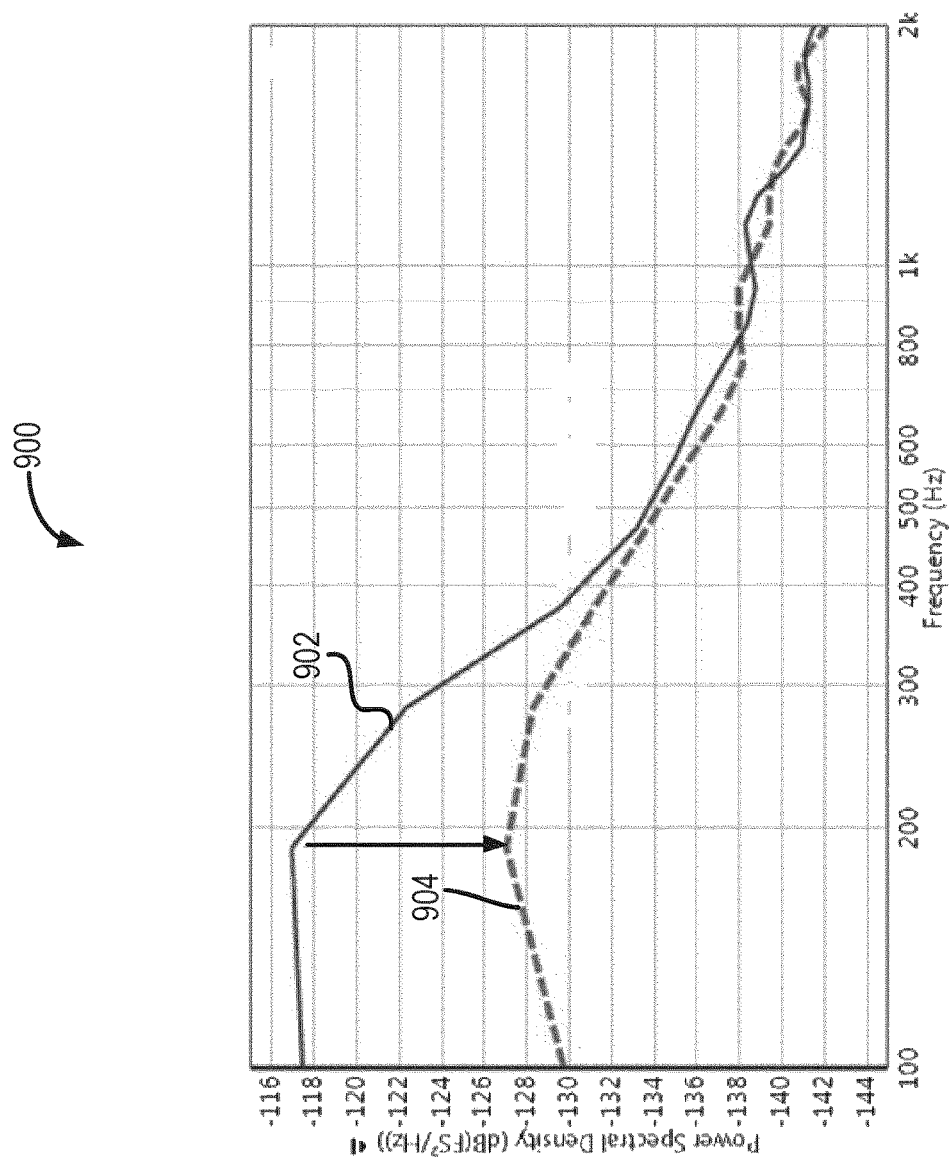
FIG. 9 depicts example test data showing an attenuation of a noise component in a digital microphone system.

FIG. 9 depicts example test data 900 showing an attenuation of a noise component in a digital microphone system when used in the stereo mode (i.e., a "left" and a "right" microphones are connected in a manner illustrated in FIG. 6). In particular, the test data 900 shows a first power spectral density (PSD) waveform 902 and a second PSD waveform 904 within a frequency range of about 100 Hz to about 2 kHz. The first and second PSD waveforms 902 and 904 represent the PSD of an encoded digital signal output by a digital converter, such as the encoded digital signal output by the DDC 308 (FIG. 3). The first PSD waveform 902 represents the PSD of the encoded digital signal when no DC offset, such as the DC value input 316, is applied the digital signal converted by the digital converter. The second PSD waveform 904 represents the PSD of the encoded digital signal when a DC value provided, for example, by the DC value input 316, is added to the digital signal. The resulting reduction in the noise component due to idle tones is reflected in the reduction in the PSD of the second PSD waveform 904 in relation to that of the first PSD waveform 902. For example, at about 200 Hz, a reduction in the PSD of about 8 dB can be observed.

In one aspect, this disclosure describes a method in a digital microphone assembly including an acoustic microelectromechanical systems (MEMS) transducer and an integrated circuit. The method includes converting an analog signal output by the acoustic transducer to a digital signal. The method also includes removing a direct current (DC) signal component from the digital signal. The method further includes, after removing the DC signal component, converting the digital signal to a pulse density modulated (PDM) signal having an idle tone frequency that is approximately one-half a frequency at which at least a portion of the integrated circuit is clocked. The method also includes offsetting the idle tone frequency by applying a DC offset to the digital signal after removing the DC signal component and before converting the digital signal into a PDM signal.

In some embodiments, the method can also include offsetting the idle tone frequency in response to a signal indicating that the microphone assembly is being used in stereo mode, and not offsetting the idle tone frequency absent the signal indicating that the microphone assembly is being used in stereo mode. In some embodiments, the acoustic transducer and the integrated circuit are disposed in a housing of the microphone assembly, wherein receiving the signal indicating that the microphone assembly is being used in stereo mode is receivable via an external device interface of the microphone assembly. In some embodiments, converting the digital signal into a PDM signal includes converting the digital signal into a 1-bit PDM signal. In some embodiments, a difference between the idle tone frequency with and without the DC offset is greater than a human audible range of frequencies. In some embodiments, converting the analog signal output by the acoustic transducer to the digital signal includes converting the analog signal using a multi-bit converter. In some embodiments, removing the direct current (DC) signal component from the digital signal includes filtering the digital signal with a high-pass filter.

In some aspects, this disclosure describes a microphone device. The microphone device includes an acoustic microelectromechanical systems (MEMS) transducer configured to generate an analog signal responsive to an acoustic signal. The microphone device also includes a signal processing circuit coupled to the transducer. The signal processing circuit includes an analog-to-digital converter configured to convert the analog signal generated by the transducer to a digital signal. The signal processing circuit also includes a filter configured to remove a direct current (DC) signal component from the digital signal. The signal processing circuit further includes a DC offset circuit configured to apply a DC offset to the digital signal after the DC component is removed. The signal processing circuit further includes a digital-to-digital converter configured to convert the digital signal having the DC offset to a pulse density modulated (PDM) signal having an idle tone frequency that is approximately one-half a clock frequency of at least a portion of the signal processing circuit. where the idle tone frequency is offset by the DC offset applied to the digital signal.

In some embodiments, the signal processing circuit is further configured to apply the DC offset in response to receiving a signal indicating that the microphone device is being used in stereo mode, and not apply the DC offset absent the signal indicating that the microphone device is being used in stereo mode. In some embodiments, the transducer and the signal processing circuit are disposed in a housing including a surface mount external-device interface wherein the signal indicating that the microphone device is being used in stereo mode is receivable via the external device interface. In some embodiments, the PDM signal is a 1-bit PDM signal. In some embodiments, a difference between the offset idle tone frequency and an idle tone frequency that would be produced without the DC offset is greater than a bandwidth corresponding to a range of human audible frequencies. In some embodiments, the analog-to-digital converter is a multi-bit converter. In some embodiments, the filter is a high pass filter.

In some aspects, this disclosure discusses an audio signal processing circuit for a microphone device. The circuit includes an analog to digital converter configured to convert an analog signal received from an acoustic transducer to a digital signal. The circuit further includes a filter configured to remove a direct current (DC) signal component from the digital signal. The circuit also includes a DC offset circuit configured to apply a DC offset to the digital signal after the DC signal component is removed. The circuit further includes a digital-to-digital converter configured to convert the digital signal to a 1-bit pulse density modulated (PDM) signal after the DC offset is applied to the digital signal, where the PDM signal has an idle tone frequency that is offset by the DC offset and the offset idle tone frequency is approximately one-half a clock frequency of the digital-to-digital converter.

In some embodiments, the signal processing circuit is further configured to selectively apply the DC offset to the digital signal in response to receiving a selection signal. In some embodiments, the PDM signal is a 1-bit PDM signal. In some embodiments, a difference between the offset idle tone frequency and an idle tone frequency that would be produced without the DC offset is greater than a bandwidth corresponding to a range of human audible frequencies. In some embodiments, the analog-to-digital converter is a multi-bit converter. In some embodiments, the filter is a high pass filter.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method in a digital microphone assembly including an acoustic microelectromechanical systems (MEMS) transducer and an integrated circuit, the method comprising:
    converting an analog signal output by the acoustic transducer to a digital signal;
    removing a direct current (DC) signal component from the digital signal;
    after removing the DC signal component, converting the digital signal to a pulse density modulated (PDM) signal having an idle tone frequency that is approximately one-half a frequency at which at least a portion of the integrated circuit is clocked; and
    offsetting the idle tone frequency by applying a DC offset to the digital signal after removing the DC signal component and before converting the digital signal into a PDM signal.

2. The method of claim 1, further comprising offsetting the idle tone frequency in response to a signal indicating that the microphone assembly is being used in stereo mode, and not offsetting the idle tone frequency absent the signal indicating that the microphone assembly is being used in stereo mode.

3. The method of claim 2, wherein the acoustic transducer and the integrated circuit are disposed in a housing of the microphone assembly, wherein receiving the signal indicating that the microphone assembly is being used in stereo mode is receivable via an external device interface of the microphone assembly.

4. The method of claim 1, wherein converting the digital signal into a PDM signal includes converting the digital signal into a 1-bit PDM signal.

5. The method of claim 1, wherein a difference between the idle tone frequency with and without the DC offset is greater than a human audible range of frequencies.

6. The method of claim 1, wherein converting the analog signal output by the acoustic transducer to the digital signal includes converting the analog signal using a multi-bit converter.

7. The method of claim 1, wherein removing the direct current (DC) signal component from the digital signal includes filtering the digital signal with a high-pass filter.

8. A microphone device comprising:
    an acoustic microelectromechanical systems (MEMS) transducer configured to generate an analog signal responsive to an acoustic signal; and
    a signal processing circuit coupled to the transducer, the signal processing circuit including:
        an analog-to-digital converter configured to convert the analog signal generated by the transducer to a digital signal,
        a filter configured to remove a direct current (DC) signal component from the digital signal,
        a DC offset circuit configured to apply a DC offset to the digital signal after the DC component is removed, and
        a digital-to-digital converter configured to convert the digital signal having the DC offset to a pulse density modulated (PDM) signal having an idle tone frequency that is approximately one-half a clock frequency of at least a portion of the signal processing circuit,
    wherein the idle tone frequency is offset by the DC offset applied to the digital signal.

9. The microphone device of claim 8, wherein the signal processing circuit is further configured to:
    apply the DC offset in response to receiving a signal indicating that the microphone device is being used in stereo mode, and
    not apply the DC offset absent the signal indicating that the microphone device is being used in stereo mode.

10. The microphone device of claim 9, wherein the transducer and the signal processing circuit are disposed in a housing including a surface mount external-device interface wherein the signal indicating that the microphone device is being used in stereo mode is receivable via the external device interface.

11. The microphone device of claim 10, wherein the PDM signal is a 1-bit PDM signal.

12. The microphone device of claim 11, wherein a difference between the offset idle tone frequency and an idle tone frequency that would be produced without the DC offset is greater than a bandwidth corresponding to a range of human audible frequencies.

13. The microphone device of claim 12, wherein the analog-to-digital converter is a multi-bit converter.

14. The microphone device of claim 8, wherein the filter is a high pass filter.

15. An audio signal processing circuit for a microphone device, the circuit comprising:
   an analog to digital converter configured to convert an analog signal received from an acoustic transducer to a digital signal,
   a filter configured to remove a direct current (DC) signal component from the digital signal;
   a DC offset circuit configured to apply a DC offset to the digital signal after the DC signal component is removed; and
   a digital-to-digital converter configured to convert the digital signal to a 1-bit pulse density modulated (PDM) signal after the DC offset is applied to the digital signal,
   wherein the PDM signal has an idle tone frequency that is offset by the DC offset and the offset idle tone frequency is approximately one-half a clock frequency of the digital-to-digital converter.

16. The circuit of claim 15, wherein the signal processing circuit is further configured to selectively apply the DC offset to the digital signal in response to receiving a selection signal.

17. The circuit of claim 16, wherein the PDM signal is a 1-bit PDM signal.

18. The circuit of claim 17, wherein a difference between the offset idle tone frequency and an idle tone frequency that would be produced without the DC offset is greater than a bandwidth corresponding to a range of human audible frequencies.

19. The circuit of claim 18, wherein the analog-to-digital converter is a multi-bit converter.

20. The circuit of claim 19, wherein the filter is a high pass filter.

* * * * *